United States Patent [19]

Lange et al.

[11] Patent Number: 4,471,309
[45] Date of Patent: Sep. 11, 1984

[54] VACUUM DETECTOR

[75] Inventors: William J. Lange, Murrysville; Clive W. Kimblin; John F. Perkins, both of Pittsburgh; Roy E. Voshall, Monroeville; Fred Bould, Pittsburgh, all of Pa.

[73] Assignee: Westinghouse Electric Corp., Pittsburgh, Pa.

[21] Appl. No.: 347,221

[22] Filed: Feb. 9, 1982

[51] Int. Cl.³ .............................................. G01L 21/34
[52] U.S. Cl. .................................. 324/463; 324/424; 324/460; 361/2
[58] Field of Search ............... 324/463, 424, 460, 157, 324/127; 361/2; 200/144 B, 146 AA

[56] References Cited

U.S. PATENT DOCUMENTS

| 3,263,162 | 7/1966 | Lucek et al. | 324/33 |
| 3,332,014 | 7/1967 | Orths et al. | 324/157 |
| 3,403,297 | 9/1968 | Crouch | 317/62 |
| 3,495,165 | 2/1970 | Cobine et al. | 324/460 |
| 3,575,656 | 4/1971 | Watrous, Jr. | 324/33 |
| 3,885,213 | 5/1975 | Rioux et al. | 324/127 |
| 4,000,457 | 12/1976 | O'Neal | 324/33 |

Primary Examiner—Michael J. Tokar
Assistant Examiner—Kevin D. O'Shea
Attorney, Agent, or Firm—Benjamin Hudson, Jr.

[57] ABSTRACT

There is provided a novel vacuum detection means utilizing a high frequency, high voltage device to excite an electrical discharge in a vacuum whose characteristics are dependent on the level of the vacuum contained therein. This discharge current allows the degree of vacuum to be continuously monitored.

3 Claims, 2 Drawing Figures

U.S. Patent   Sep. 11, 1984   4,471,309

VACUUM DETECTOR

BACKGROUND OF THE INVENTION

1. Field of the Invention

This invention relates generally to monitoring means for measuring the vacuum in vacuum devices and more particularly to measuring the degree of the vacuum in vacuum circuit interrupters.

2. Description of the Prior Art

The desirable characteristics of a vacuum as a dielectric medium have resulted in increasing use of vacuum circuit interrupters as protective devices in power distribution networks. Maintaining the vacuum in the interrupter is critical for safe and reliable operation. Consequently, power system engineers have been attempting to develop more effective and reliable means to monitor the internal pressure of the vacuum circuit interrupter.

A patent of interest is U.S. Pat. No. 3,403,297 entitled "Vacuum-Type Circuit Interrupter with Pressure-Monitoring Means" issued to D. W. Crouch, Sept. 24, 1968, discloses a vacuum monitoring means using a high potential to ignite a discharge within the vacuum. Other patents of interest are U.S. Pat. No. 3,575,656, issued Apr. 20, 1971; U.S. Pat. No. 3,263,162 issued July 26, 1966; and U.S. Pat. No. 4,000,457 issued Dec. 28, 1976, all of which employ cold cathode ionization gauges for monitoring the vacuum.

SUMMARY OF THE INVENTION

There is provided by this invention a novel vacuum detection means utilizing a high frequency device such as a Tesla coil to generate a high frequency, high voltage which is applied to a vacuum device for exciting an electrical discharge whose characteristics are dependent on the level of vacuum contained therein.

DESCRIPTION OF THE PREFERRED EMBODIMENTS

Figure 1:
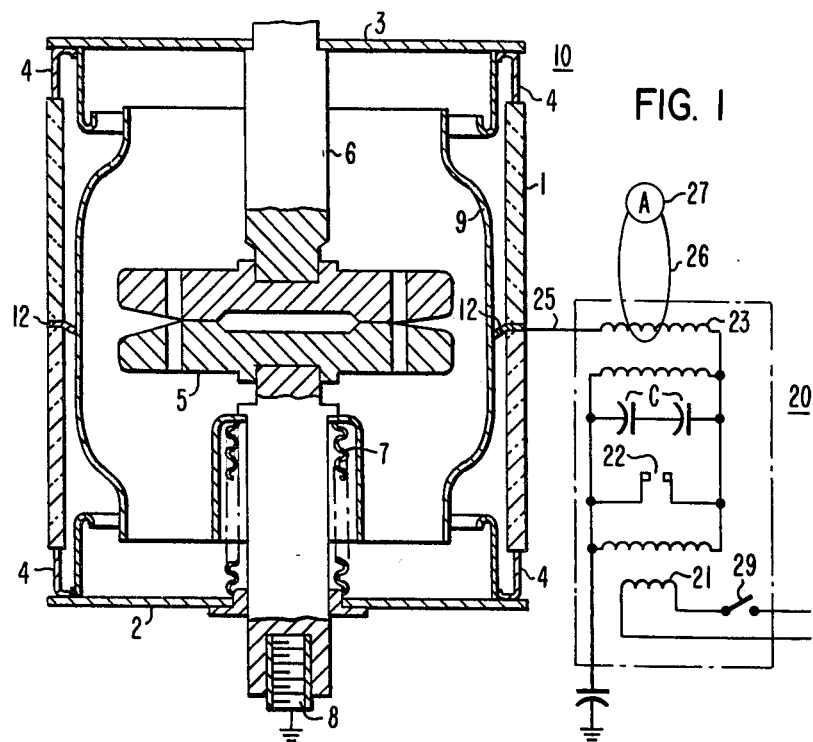
FIG. 1 is a sectional view of a vacuum circuit interrupter incorporating the principles of this invention.

Referring to FIG. 1, there is shown a vacuum circuit interrupter 10. The interrupter 10 is comprised of a cylindrical insulating side wall 1 and end walls 2 and 3. The end walls are sealed to the side walls by means of vacuum seals 4. A relatively stationary electrical contact 6 is fixedly secured to the end wall 3. Cooperable with the relatively stationary contact structure 6 is a relatively movable contact structure 5 supported on a movable contact operating rod 8. A resilient bellows 7 is fixedly secured to the movable contact structure 5 to allow movement of the movable electrical contact structure without disturbing the vacuum pressure within the housing 1. A central generally cylindrically shaped condensing shield 9 which is typically supported by center flange rings 12 between end walls 2 and 3 serves to condense the vaporized metal emitted from the contact structures 5 and 6 during arcing conditions. The condensing shield 9 prevents arcing products from reaching the inner wall surfaces of the cylindrical insulating housing 1. In accordance with the principles of this invention, there is shown a vacuum detector comprised generally of a Tesla coil 20 having a high voltage transformer 21, a spark gap 22, and a high frequency oscillator 23, that supplies a high frequency, high voltage to the vacuum condensing shield 9 by means of a high frequency, high voltage lead 25. A single loop of 10 mil wire is placed around the oscillator windings 23 of the Tesla coil in series with a 100 $\mu$A AC meter 27. The relatively movable electrical contact 5 is grounded. When switch 29 is closed on the Tesla coil to apply an AC voltage to the primary of the high voltage transformer, the high frequency, high voltage applied to the condenser shield 9 by means of the high frequency lead 25 sets up an electrical discharge within the vacuum circuit interrupter that is proportional to the pressure of the vacuum contained therein. The effect of this discharge current is measured by the single loop of wire around the oscillator windings 23 of the Tesla coil in series with the 100 $\mu$A ammeter. At low pressure the current in the added loop is high, approximately 100 $\mu$A amps; as the pressure is increased, little change in the current occurred until the pressure rises to $3 \times 10^{-2}$ Torr when it drops by a factor of 2. The change in the induced current in the meter loop in the disclosed vacuum detector arises because of the change in the current in the secondary of the Telsa coil when discharge current flows in the vacuum device. This relatively abrupt change in current is advantageous in that it can be easily translated into good-bad, or pass-fail, signals.

Figure 2:
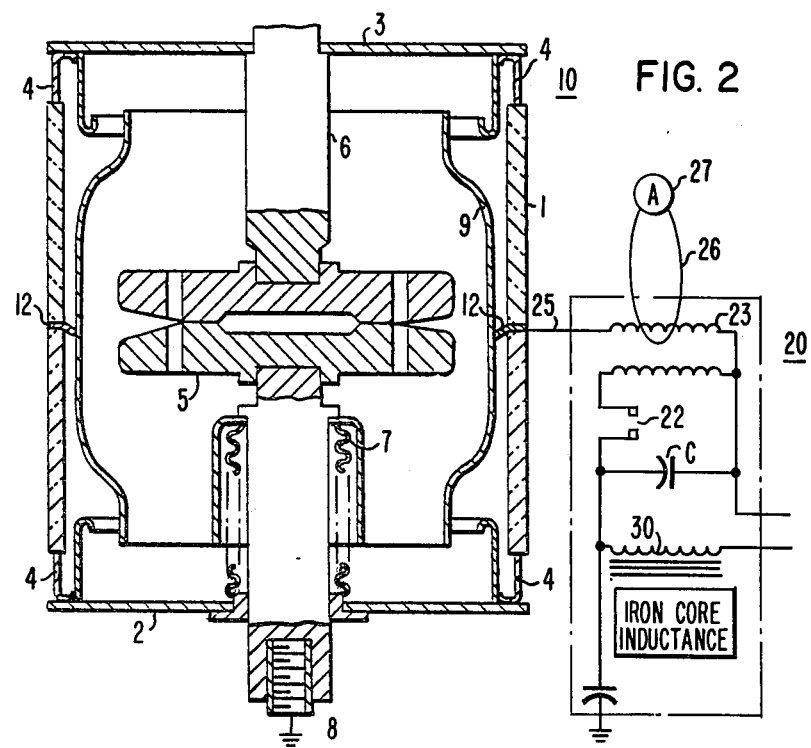
FIG. 2 is an alternate embodiment of a vacuum circuit interrupter incorporating the principles of this invention.

Referring now to FIG. 2 there is shown an alternate embodiment of the vacuum detector but substituting an iron core inductance type high voltage transformer 30 in the Tesla coil configuration for the air gap type shown in FIG. 1.

It can be readily seen that there is provided by this invention a novel vacuum detector utilizing a high frequency voltage to excite an electrical discharge whose current is related proportional to the degree of vacuum located in a particular vacuum structure.

Although there has been illustrated and described a specific embodiment, it is clearly understood that the same were merely for purposes of illustration and that changes and modifications may readily be made therein by those skilled in the art without departing from the spirit and scope of this invention.

We claim:

1. A vacuum detector, comprising:
   (a) a high frequency, high voltage source means disposed to excite an electrical discharge current in a vacuum device; and
   (b) an a.c. metering means connected to the oscillator windings of the high frequency, high voltage source means disposed to measure the effect of said electrical discharge current.

2. A vacuum detector as recited in claim 1 wherein said high frequency, high voltage source means is comprised of a Tesla coil.

3. A vacuum detector as recited in claim 1 wherein said metering means is comprised of a loop of wire in series with an ammeter disposed to measure an induced current related to the amount of said electrical discharge current.

* * * * *